United States Patent
Son

(10) Patent No.: US 9,877,381 B2
(45) Date of Patent: Jan. 23, 2018

(54) COMPOSITE ELECTRONIC COMPONENT AND BOARD ON WHICH COMPOSITE ELECTRONIC COMPONENT IS MOUNTED

(71) Applicant: SAMSUNG ELECTRO-MECHANICS CO., LTD., Suwon-si, Gyeonggi-do (KR)

(72) Inventor: Soo Hwan Son, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/195,685

(22) Filed: Jun. 28, 2016

(65) Prior Publication Data

US 2017/0099727 A1 Apr. 6, 2017

(30) Foreign Application Priority Data

Oct. 1, 2015 (KR) .......................... 10-2015-0138449

(51) Int. Cl.
*H01G 4/30* (2006.01)
*H05K 1/18* (2006.01)
(Continued)

(52) U.S. Cl.
CPC .......... *H05K 1/0231* (2013.01); *H01G 2/065* (2013.01); *H01G 2/10* (2013.01); *H01G 4/30* (2013.01); *H01G 4/38* (2013.01); *H01G 9/0029* (2013.01); *H01G 9/042* (2013.01); *H01G 15/00* (2013.01); *H05K 1/181* (2013.01);
(Continued)

(58) Field of Classification Search
CPC ................... H05K 1/111; H05K 1/181; H05K 2201/10015; H01G 4/012; H01G 4/0085; H01G 4/12; H01G 4/30; H01G 4/38; H01G 4/1127; H01G 2/06; H01G 9/15; H01G 9/042042
See application file for complete search history.

(56) References Cited

U.S. PATENT DOCUMENTS

2007/0035013 A1\* 2/2007 Handa ................. H01L 23/5389
257/717
2007/0211414 A1\* 9/2007 Pelcak ................... H01G 9/012
361/541
(Continued)

FOREIGN PATENT DOCUMENTS

JP 09-232196 A 9/1997
JP 09-326334 A 12/1997
(Continued)

*Primary Examiner* — Hoa C Nguyen
(74) *Attorney, Agent, or Firm* — McDermott Will & Emery LLP

(57) ABSTRACT

A composite electronic composite includes a plurality of multilayer ceramic capacitors each including a ceramic body in which dielectric layer and internal electrodes are alternately disposed and first and second external electrodes disposed on a lower surface of the ceramic body, a tantalum capacitor including a body part including a sintered tantalum powder material and a tantalum wire of which a portion is embedded in the body part and disposed on the plurality of multilayer ceramic capacitors, and a molding portion enclosing the tantalum capacitor and the plurality of multilayer ceramic capacitors.

15 Claims, 6 Drawing Sheets

(51) Int. Cl.
  *H05K 1/02* (2006.01)
  *H01G 2/06* (2006.01)
  *H01G 2/10* (2006.01)
  *H01G 4/38* (2006.01)
  *H01G 9/00* (2006.01)
  *H01G 9/042* (2006.01)
  *H01G 15/00* (2013.01)

(52) U.S. Cl.
  CPC .............. *H05K 2201/10015* (2013.01); *H05K 2201/10515* (2013.01); *H05K 2201/10522* (2013.01)

(56) References Cited

U.S. PATENT DOCUMENTS

| | | | |
|---|---|---|---|
| 2008/0186652 A1* | 8/2008 | Lee | H01G 4/012 361/306.3 |
| 2010/0033904 A1 | 2/2010 | Niki | |
| 2012/0204389 A1* | 8/2012 | Ibata | H01G 9/012 29/25.42 |

FOREIGN PATENT DOCUMENTS

| | | |
|---|---|---|
| JP | 2000-173860 A | 6/2000 |
| WO | 2008/044483 A1 | 4/2008 |

\* cited by examiner

COMPOSITE ELECTRONIC COMPONENT AND BOARD ON WHICH COMPOSITE ELECTRONIC COMPONENT IS MOUNTED

CROSS-REFERENCE TO RELATED APPLICATION

This application claims benefit of priority to Korean Patent Application No. 10-2015-0138449 filed on Oct. 1, 2015, with the Korean Intellectual Property Office, the disclosure of which is incorporated herein by reference.

TECHNICAL FIELD

The present disclosure relates to a composite electronic component including a plurality of passive devices and a board on which a composite electronic component is mounted.

BACKGROUND

A multilayer ceramic capacitor, a type of multilayer chip electronic component, may have a structure in which a plurality of dielectric layers and internal electrodes interposed between the dielectric layers and having different polarities are alternately stacked.

Meanwhile, the multilayer ceramic capacitor may have low equivalent series resistance (ESR) and equivalent series inductance (ESL) characteristics, but may have worse DC-bias characteristics than those of the tantalum capacitor and implementing a high level of capacitance may be difficult.

In addition, the multilayer ceramic capacitor may have a problem in that acoustic noise may occur at the time of directly mounting the multilayer ceramic capacitor on a board.

Meanwhile, the tantalum capacitor may implement high capacitance and have excellent DC-bias characteristics, but may have a problem in that equivalent series resistance (ESR) may be high.

Further, low equivalent series inductance (ESL) characteristics of the composite electronic component may be barely implemented.

SUMMARY

An aspect of the present disclosure may provide a composite electronic component having low equivalent series inductance (ESL) and a low equivalent series resistance (ESR) and having improved DC-bias characteristics and high capacitance.

Another aspect of the present disclosure may provide a composite electronic component having an excellent acoustic noise reduction effect.

According to an aspect of the present disclosure, there is provided a composite electronic component including: a composite body including a plurality of multilayer ceramic capacitors and a tantalum capacitor, in which the plurality of multilayer ceramic capacitors may be connected to the tantalum capacitor in parallel while being disposed below the tantalum capacitor, to thereby reduce equivalent series inductance (ESL).

According to another aspect of the present disclosure, a board having a composite electronic component may include: a printed circuit board on which electrode pads are disposed; the composite electronic component being installed on the printed circuit board; and solders connecting the electrode pads and the composite electronic component to each other.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
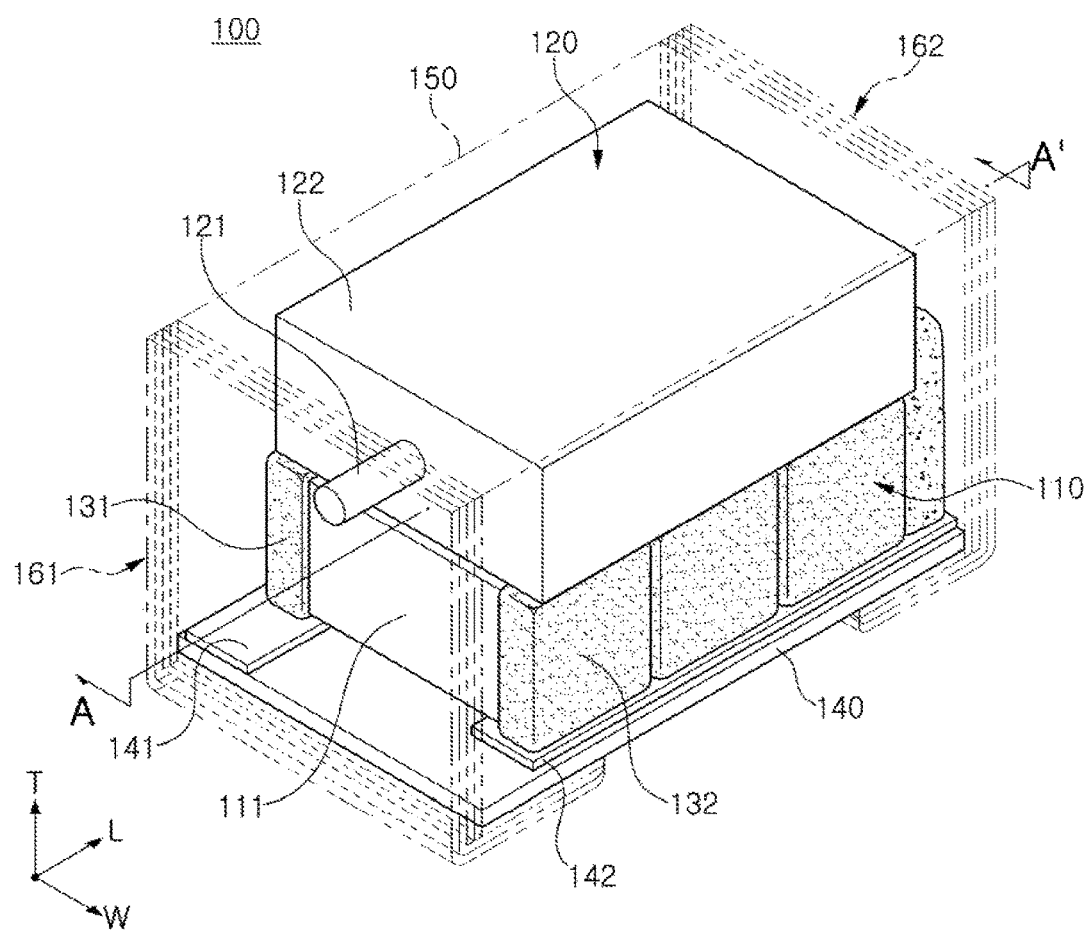
FIG. 1 is a perspective view showing a terminal electrode and a molding portion of a composite electronic component according to an exemplary embodiment in the present disclosure.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

Composite Electronic Component

Hereinafter, exemplary embodiments in the present disclosure will be described with reference to the accompanying drawings.

FIG. 1 is s perspective view showing a terminal electrode and a molding portion of a composite electronic component according to an exemplary embodiment in the present disclosure.

Referring to FIG. 1, a composite electrode component 100 according to an exemplary embodiment in the present disclosure may include an insulating sheet 140, a plurality of multilayer ceramic capacitors 110, a tantalum capacitor 120, a molding portion 150, and terminal electrodes 161 and 162.

The plurality of multilayer ceramic capacitors 110 may be disposed on the insulating sheet 140 and the tantalum capacitor 110 may be disposed on the plurality of multilayer ceramic capacitors 110.

The terminal electrodes 161 and 162 may include a positive electrode terminal 161 and a negative electrode terminal 162.

According to an exemplary embodiment in the present disclosure, due to a structure of the composite electronic component including the plurality of multilayer ceramic capacitors 110 and the tantalum capacitor 120, an acoustic noise reduction effect may be excellent, a high degree of capacitance may be implemented, and equivalent series resistance (ESR)/equivalent series inductance (ESL) characteristics may be low, and direct current (DC)-bias characteristics may be improved.

The tantalum capacitor may implement the high capacitance and have the excellent DC-bias characteristics, but may have a problem in that the equivalent series resistance (ESR) is high.

Meanwhile, the multilayer ceramic capacitor may have low equivalent series resistance (ESR) and equivalent series inductance (ESL) characteristics, but may have DC-bias characteristics worse than those of the tantalum capacitor and may have trouble implementing high capacitance.

In addition, the multilayer ceramic capacitor may have a problem in that acoustic noise may occur at the time of directly mounting the multilayer ceramic capacitor on the board.

However, since the composite electronic component 100 according to an exemplary embodiment in the present disclosure may include the plurality of multilayer ceramic capacitors 110 and the tantalum capacitor 120 to decrease a high equivalent series resistance (ESR) which is a disadvantage of the tantalum capacitor.

The deterioration in the DC-bias characteristics, that is, the disadvantages of the multilayer ceramic capacitor, may be improved.

According to the exemplary embodiment in the present disclosure, the plurality of multilayer ceramic capacitors are disposed on the insulating sheet to thereby make the acoustic noise reduction effect excellent due to the multilayer ceramic capacitor.

The plurality of multilayer ceramic capacitors 110 may have the tantalum capacitor 120 disposed thereon and the plurality of multilayer ceramic capacitors 110 and the tantalum capacitor 120 may be connected to each other in parallel, to thereby implement a lot lower equivalent series inductance (ESL) characteristics.

Figure 2:
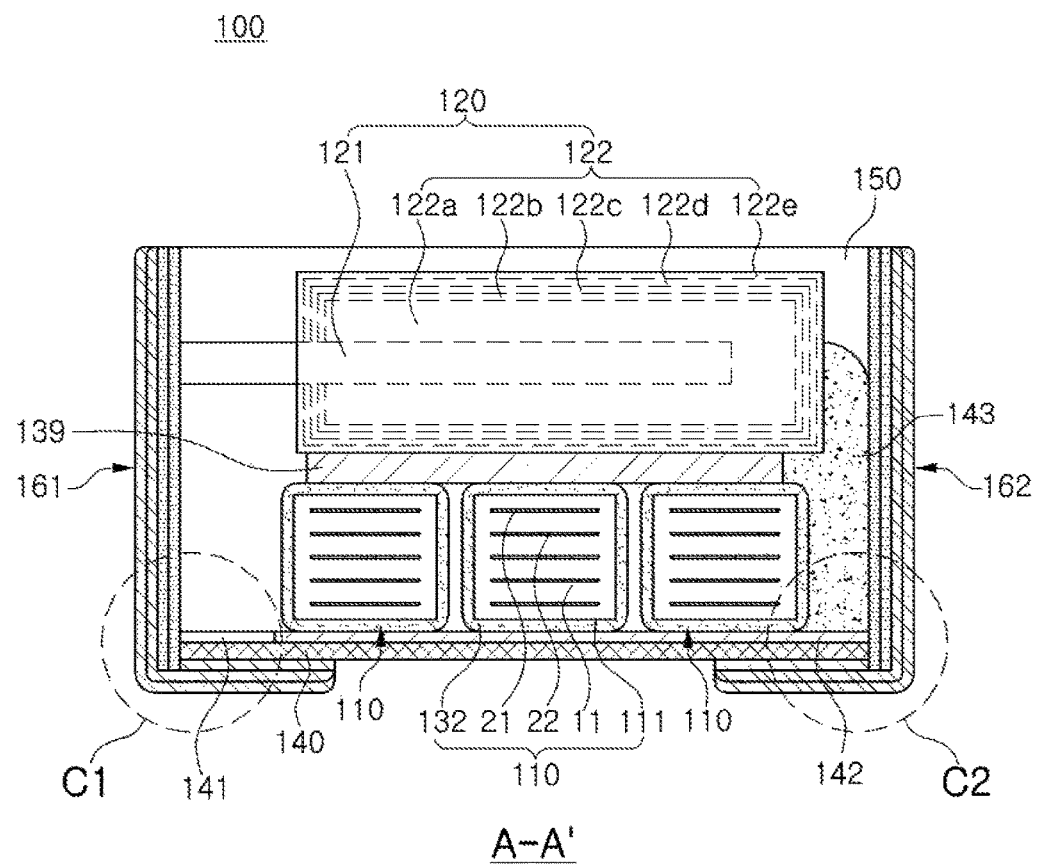
FIG. 2 is a cross-sectional view taken along line A-A' of FIG. 1.

FIG. 2 is a cross-sectional view taken along line A-A' of FIG. 1.

As shown in FIGS. 1 and 2, according to the exemplary embodiment in the present disclosure, the plurality of multilayer ceramic capacitors 110 each may include a ceramic body 111 in which dielectric layers 11 and internal electrodes 21 and 22 are alternately disposed and external electrodes 131 and 132 formed on an outer surface of the ceramic body to be connected to the internal electrodes 21 and 22.

The ceramic body 111 may have an approximately hexahedral shape in which it has upper and lower surfaces opposing each other in a thickness direction, first and second side surfaces opposing each other in a length direction, and third and fourth side surfaces opposing each other in a width direction.

In an exemplary embodiment in the present disclosure, the upper surface may be a mounting surface adjacent to and facing the insulating sheet 140 when the multilayer ceramic capacitor 110 is disposed on the insulating sheet 140A mounting surface adjacent to and facing the insulating sheet may be the lower surface and a surface opposing the lower surface may be the upper surface, after the multilayer ceramic capacitor 110 is disposed on the insulating sheet 140.

FIGS. 1 and 2 illustrate that the plurality of multilayer ceramic capacitors 110 are disposed in an amount of three, but the number of multilayer ceramic capacitors 110 is not limited thereto. Therefore, at least two multilayer ceramic capacitors 110 may be disposed below the tantalum capacitor 120. An insulating material 139 made of, for example, an adhesive material, may be disposed between the tantalum capacitor 120 and the plurality of ceramic capacitors 110 to bond the tantalum capacitor 120 and the plurality of ceramic capacitors 110 to each other and to electrically isolate a negative electrode layer 122e (to be described later) of a body part 122 (to be described later) of the tantalum capacitor 120 from first and second external electrodes 131 and 132 of the plurality of ceramic capacitors 110. Alternatively, although not shown in FIGS. 1 and 2, the insulating material 139 may be disposed between the tantalum capacitor 120 and the plurality of ceramic capacitors 110 to electrically isolate the negative electrode layer 122e of the body part 122 of the tantalum capacitor 120 only from the first external electrodes 131 of the plurality of ceramic capacitors 110. In this case, the negative electrode layer 122e of the body part 122 of the tantalum capacitor 120 and the second external electrodes 132 of the plurality of ceramic capacitors 110 may be directly electrically connected to each other or electrically connected to each other through an electrically conductive material (not shown) disposed therebetween. The conductive material may be made of an adhesive material.

Further, the plurality of multilayer ceramic capacitors 110 may be connected to the tantalum capacitor 120 in parallel and the multilayer ceramic capacitors 110 may be connected to each other in parallel.

As such, each of the components may be connected to each other in parallel, to thereby implement much lower equivalent series inductance (ELS) characteristics.

The internal electrodes 21 and 22 may include the first and second internal electrodes 21 and 22, in which the first and second internal electrodes 21 and 22 may be alternately disposed on the dielectric layer 11, having one dielectric layer disposed therebetween.

The ceramic body 111 may be formed by stacking and then sintering the plurality of dielectric layers 11 and the internal electrodes 21 and 22.

The dielectric layer 11 may include ceramic powder particles having a high k, for example, barium titanate ($BaTiO_3$) based powder particles or strontium titanate ($SrTiO_3$) based powder particles. However, the dielectric layer 11 is not limited thereto.

A material forming the first and second internal electrodes 21 and 22 is not limited, but may be a conductive paste formed of one or more selected from the group consisting of, for example, a noble metal material such as palladium (Pd), a palladium-silver (Pd—Ag) alloy, or the like, nickel (Ni), and copper (Cu).

The first and second internal electrodes 131 and 132 may be alternately drawn out to both side surfaces of the ceramic body 111 in the length direction.

The external electrodes 131 and 132 may be disposed on both side surfaces of the ceramic body 111 in the length direction to be electrically connected to the internal electrodes.

The external electrodes 131 and 132 may include the first and second external electrodes 131 and 132.

The first external electrode 131 may be electrically connected to the first internal electrode 21 drawn out to a first side surface in the length direction of the ceramic body 111 and the second external electrode 132 may be electrically connected to the second internal electrode 22 drawn out to the second side surface that is the other side surface in the length direction of the ceramic body 111.

According to an exemplary embodiment in the present disclosure, nickel/tin (Ni/Sn) plating layers may not be disposed on the first and second external electrodes 131 and 132 unlike a general multilayer ceramic capacitor.

Since the composite electronic component includes the molding portion 150 disposed so as to enclose the multilayer ceramic capacitor 110 disposed on the upper surface of the insulating sheet 140 and the tantalum capacitor 120 disposed on the multilayer ceramic capacitor 110 as described below, the plating layers do not have to be formed on the first and second external electrodes 131 and 132 of the multilayer ceramic capacitor 110.

Therefore, a problem in which reliability is decreased due to penetration of a plating solution into the ceramic body 111 of the multilayer ceramic capacitor 110 may be prevented.

As shown in FIG. 2, according to an exemplary embodiment in the present disclosure, the tantalum capacitor 120 may include a body part 122 and a tantalum wire 121, in which the tantalum wire 121 may be embedded in the body part 122 so that a portion in the length direction thereof is exposed through one surface of the body part 122.

The body part 122 of the tantalum capacitor 120 may include a positive electrode body 122a, a dielectric layer 122b, a solid electrolyte layer 122c, a carbon layer 122d, and a negative electrode layer 122e but is not limited thereto.

The positive electrode body 122a may be formed of a porous sintered material of tantalum powder particles.

A surface of the positive electrode body 122a may be provided with the dielectric layer 122b. The dielectric layer may be formed by oxidizing the surface of the positive electrode body. For example, the dielectric layer 122b may be formed of a dielectric material formed of a tantalum oxide ($Ta_2O_5$), which is an oxide of tantalum forming the positive electrode body 122a, and be formed to a predetermined thickness on the surface of the positive electrode body 122a.

The surface of the dielectric layer 122b may be provided with the solid electrolyte layer 122c. The solid electrolyte layer 122c may contain one or more of a conductive polymer and a manganese dioxide ($MnO_2$).

When the solid electrolyte layer 122c is formed of the conductive polymer, the solid electrolyte layer 122c may be formed on the surface of the dielectric layer by a chemical polymerization method or an electrolytic polymerization method. A material of the conductive polymer is not limited as long as it is a polymer having conductivity, but may include, for example, polypyrrole, polythiophene, polyaniline, or the like.

In the case in which the solid electrolyte layer 122c is formed of the manganese dioxide ($MnO_2$), a conductive manganese dioxide may be formed on the surface of the dielectric layer by immersing the positive electrode body having the dielectric layer formed on the surface thereof in a manganese aqueous solution such as a manganese nitrate and then decomposing the manganese aqueous solution by heating.

The carbon layer 122d including carbon may be disposed on the solid electrolyte layer 122c.

The carbon layer 122d may be formed of carbon pastes and be formed by applying the carbon pastes in which conductive carbon material powder particles such as natural graphite, carbon black, or the like, are dispersed in water or an organic solvent in a state in which they are mixed with a binder, a dispersing agent, or the like onto the solid electrolyte layer 122c.

The negative electrode layer 122e containing a conductive metal may be disposed on the carbon layer 122d in order to improve electrical connectivity with the negative electrode terminal, wherein the conductive metal contained in the negative electrode layer 122e may be silver (Ag).

The tantalum capacitor may be connected to the external terminal in, for example, a structure in which an internal lead frame is not present, but is not limited thereto.

By doing so, the tantalum capacitor may have a volume larger than that of the tantalum capacitor having the structure in which the internal lead frame is formed, to thereby implement the high-capacity composite electronic component.

According to an exemplary embodiment in the present disclosure, the plurality of multilayer ceramic capacitors 110 and the tantalum capacitor 120 may be stacked with each other in a vertical direction and may be connected to each other in parallel.

According to an exemplary embodiment in the present disclosure, as shown in FIG. 2, the plurality of multilayer ceramic capacitors 110 may be disposed on the insulating sheet 140.

The insulating sheet 140 is not limited as long as it has insulation properties, but may be manufactured using an insulating material such as a ceramic based material, or the like.

The molding portion 150 may cover the multilayer ceramic capacitor 110, the tantalum capacitor 120, and the upper surface of the insulating sheet 140 on which the multilayer ceramic capacitor and the tantalum capacitor are disposed.

The molding portion 150 may protect the multilayer ceramic capacitor 110 and the tantalum capacitor 120 from an external environment and may be mainly formed of an epoxy or silica based epoxy molding compound (EMC), or the like. However, the molding portion 150 is not limited thereto.

The composite electronic component 100 according to an exemplary embodiment in the present disclosure may be implemented as one component in which the multilayer ceramic capacitor 110 and the tantalum capacitor 120 are coupled to each other due to the molding portion 150.

According to the exemplary embodiment in the present disclosure, the tantalum capacitor 120 may be disposed to contact the first and second external electrodes 131 and 132 of the plurality of multilayer ceramic capacitors 110.

According to the exemplary embodiment in the present disclosure, the plurality of multilayer ceramic capacitors 110 are disposed below the tantalum capacitor 120 and the plurality of multilayer ceramic capacitors 110 and the tantalum capacitor 120 are connected to each other in parallel, and therefore when a current is applied through the external electrodes 131 and 132, the equivalent series inductance (ESL) of the composite electronic component may be decreased.

As shown in FIG. 2, according to an exemplary embodiment in the present disclosure, the composite electronic component 100 may include a positive electrode terminal 161 and a negative electrode terminal 162 electrically connected to the multilayer ceramic capacitor 110 and the tantalum capacitor 120.

According to an exemplary embodiment in the present disclosure, the tantalum wire 121 and the first external electrode 131 of the multilayer ceramic capacitor may be electrically connected to the positive electrode terminal 161, and the body part 122 of the tantalum capacitor and the second external electrode 132 of the multilayer ceramic capacitor may be electrically connected to the negative electrode terminal 162.

The tantalum wire 121 may be exposed to a first side surface of the molding portion 150 in the length direction to be connected to the positive electrode terminal 161.

The tantalum capacitor 120 may be a tantalum capacitor having a structure in which the internal lead frame is not present and the tantalum wire 121 may be exposed to the first side surface of the molding portion 150 in the length direction, to thereby implement a degree of capacitance as large as possible as compared with the structure according to the related art.

As shown in FIG. 2, conductive connection parts 141 and 142 may be disposed on any one or more of upper and lower surfaces of the insulating sheet 140.

The conductive connection parts 141 and 142 may have any shape as long as they may contain conductive materials to electrically connect the positive and negative electrode terminals 161 and 162 outside the molding portion and a composite body 130 inside the molding portion 150 to each other as described below.

According to the exemplary embodiment in the present disclosure, the multilayer ceramic capacitor 110 and the tantalum capacitor 120 may be connected to the positive electrode terminal 161 or the negative electrode terminal 162 by the conductive connection parts 141 and 142 disposed in the molding portion.

Hereinafter, a method for connecting a multilayer ceramic capacitor 110 and a tantalum capacitor 120 to a positive electrode terminal 161 or a negative electrode terminal 162 will be described, but the present disclosure is not limited thereto.

The first external electrode 131 of the multilayer ceramic capacitor 110 may be connected to the positive electrode terminal 161 through the first conductive connection part 141 and the second external electrode 132 of the multilayer ceramic capacitor 110 may be connected to the negative electrode terminal 162 through the second conductive connection part 142.

Meanwhile, the body part 122 of the tantalum capacitor 120 may be connected to the negative electrode terminal 162 through a third conductive connection part 143.

As shown in FIG. 2, the first and second conductive connection parts 141 and 142 may have a metal pad shape, but are not limited thereto.

In addition, the metal pads may contain copper (Cu), but are not necessarily limited thereto.

The metal pad may include the first and second conductive connection parts 141 and 142 disposed on a side surface of the molding portion 150 in a width direction.

In detail, the metal pad may include the first conductive connection part 141 connected to the first external electrode 131 to be disposed on one side surface of the molding portion 150 in the width direction and exposed to one side surface in a length direction thereof and the second conductive connection part 142 connected to the second external electrode 132 to be disposed on the other side surface in the width direction of the molding portion 150 and exposed to the other side surface in the length direction thereof.

Further, the first conductive connection part 141 may be connected to the positive electrode terminal 161 and the second conductive connection part 142 may be connected to the negative electrode terminal 162.

Meanwhile, the third conductive connection part 143 may be a conductive resin part formed by hardening a conductive resin paste. A shape of the third conductive connection part may not be particularly limited as long as the body part 122 of the tantalum capacitor 120 may be connected to the negative electrode terminal 162 and as shown in FIG. 2, the third conductive connection part 143 may also be connected to the second conductive connection part 142.

The conductive resin part may include and a conductive particle and a base resin.

The conductive particle may be a silver (Ag) particle, but is not limited thereto, and the base resin may be a thermosetting resin, for example, an epoxy resin.

In addition, the conductive resin part may contain copper (Cu) as a conductive metal, but is not necessarily limited thereto.

Figure 3A:
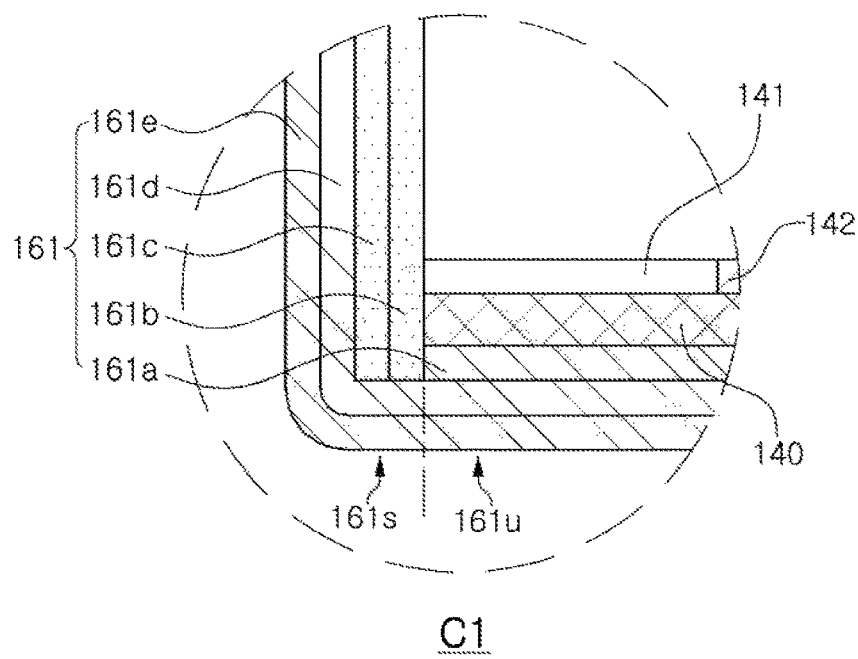
FIGS. 3A and 3B are enlarged views of regions C1 and C2 of FIG. 2.
Figure 3B:
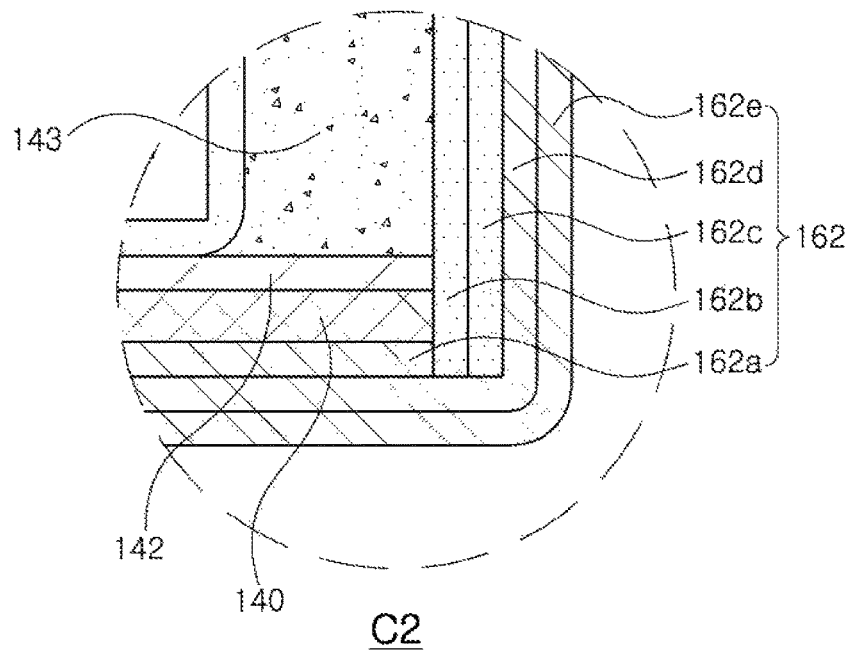

FIG. 3 is an enlarged view of regions C1 and C2 of FIG. 2.

Referring to FIGS. 2 and 3, the terminal electrodes may include the positive electrode terminal 161 and the negative electrode terminal 162.

The positive electrode terminal 161 may be disposed on a first surface of the molding portion 150 in the length direction and on a lower surface of the insulating sheet and be connected to the tantalum wire 121 and the first external electrode 131.

The negative electrode terminal 162 may be disposed on a second surface in the length direction of the molding portion 150 and the lower surface of the insulating sheet and may be connected to the body part 122 and the second external electrode 132.

According to an exemplary embodiment in the present disclosure, the positive electrode terminal 161 may extend from the first surface in the length direction of the molding portion 150 up to a portion of the lower surface of the insulating sheet 140, the negative electrode terminal 162 may extend from the second surface in the length direction of the molding portion 150 up to a portion of the lower surface of the insulating sheet 140, and the positive electrode terminal 161 and the negative electrode terminal 162 may be formed on the lower surface of the insulating sheet 140 so as to be spaced apart from each other.

The positive electrode terminal 161 may include a positive electrode side surface terminal part 161s disposed on the first surface of the molding portion 150 and a positive electrode lower surface terminal part 161u disposed on the lower surface of the insulating sheet 140, and the negative electrode terminal 162 may include a negative electrode side surface terminal part 162s disposed on the second surface of the molding portion 150 and a negative electrode lower surface terminal part 162u disposed on the lower surface of the insulating sheet 140.

According to an exemplary embodiment in the present disclosure, the positive electrode terminal 161 may include a lower surface base layer 161a, side surface base layers 161b and 161c connected to the lower surface base layer 161a, and plating layers 161d and 161e disposed so as to enclose the lower surface base layer 161a and the side surface base layers 161b and 161c.

In addition, the negative electrode terminal 162 may include a lower surface base layer 162a, side surface base layers 162b and 162c connected to the lower surface base layer 162a, and plating layers 162d and 162e disposed so as to enclose the lower surface base layer 162a and the side surface base layers 162b and 162c.

Although the lower surface base layers 161a and 162a be depicted as one layer and each of the side surface base layers 161b and 161c and the side surface base layers 162b and 162c be depicted as two layers in FIG. 3, they are not necessarily limited thereto, and may be disposed in various forms.

The positive electrode terminal 161 and the negative electrode terminal 162 may be formed by processes of dry-depositing (sputtering) and plating at least one of Cr, Ti, Cu, Ni, Pd, and Au, forming a metal layer, and etching the metal layer, but are not limited thereto.

In addition, the positive electrode terminal 161 and the negative electrode terminal 162 may be formed by forming the lower surface base layers 161a and 162a and then forming the side surface base layers 161b, 161c, 162b, and 162c so as to be connected to the lower surface base layers 161a and 162a.

The lower surface base layers 161a and 162a may be formed by etching, but are not necessarily limited thereto.

The lower surface base layers 161a and 162a may be disposed on the lower surface of the insulating sheet 140, and may have patterns formed by applying a metal thin film to the lower surface of the insulating sheet 140 and then performing an etching process in order to form the lower surface base layers 161a and 162a.

The lower surface base layers 161a and 162a are not limited, but may contain, for example, copper (Cu).

In the case in which the lower surface base layers 161a and 162a are formed of copper (Cu), they may be excellently connected to the side surface base layers 161b, 161c, 162b, and 162c formed by a separate process, and may have excellent electrical conductivity.

Meanwhile, the side surface base layers 161b, 161c, 162b, and 162c may be formed by deposition, for example, a sputtering method.

The side surface base layers 161b, 161c, 162b, and 162c are not limited, but may be formed of two layers of an inner side and an outer side.

The side surface base layers 161b and 162b of the inner side among the side surface base layers 161b, 161c, 162b, and 162c may contain any one or more of Cr or Ti, may be formed by the sputtering method, and may be connected to the lower surface base layers 161a and 162a.

The side surface base layers 161c and 162c of the outer side among the side surface base layers 161b, 161c, 162b, and 162c may contain Cu and may be formed by the sputtering method.

Figure 4:
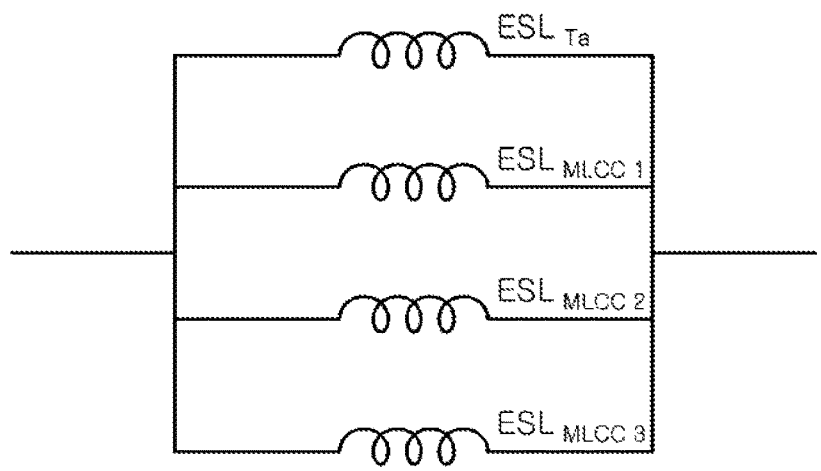
FIG. 4 is an ELS equivalent circuit diagram of the composite electronic component according to an exemplary embodiment in the present disclosure.

FIG. 4 is an ELS equivalent circuit diagram of the composite electronic component according to an exemplary embodiment in the present disclosure.

Referring to FIG. 4, in the composite electronic component according to the exemplary embodiment in the present disclosure, the plurality of multilayer ceramic capacitors and the tantalum capacitor disposed on the plurality of multilayer ceramic capacitors are both connected to each other in parallel.

Therefore, each of the components is connected to each other in parallel and thus the equivalent series inductance (ESL) is generated.

In this case, the total equivalent series inductance (ESL) of the composite electronic component may be represented by the following Equation.

$$\frac{1}{ESL_{Total}} = \frac{1}{ESL_{Ta}} + \frac{1}{ESL_{MLCC1}} + \frac{1}{ESL_{MLCC2}} + \frac{1}{ESL_{MLCC3}}$$

Referring to the equivalent circuit diagram and the above Equation, when the tantalum capacitor and the plurality of multilayer ceramic capacitors are connected to each other in parallel, it may be appreciated that $ESL_{Total}$ is significantly lower than the equivalent series inductance (ESL) of each of the components.

Figure 5:
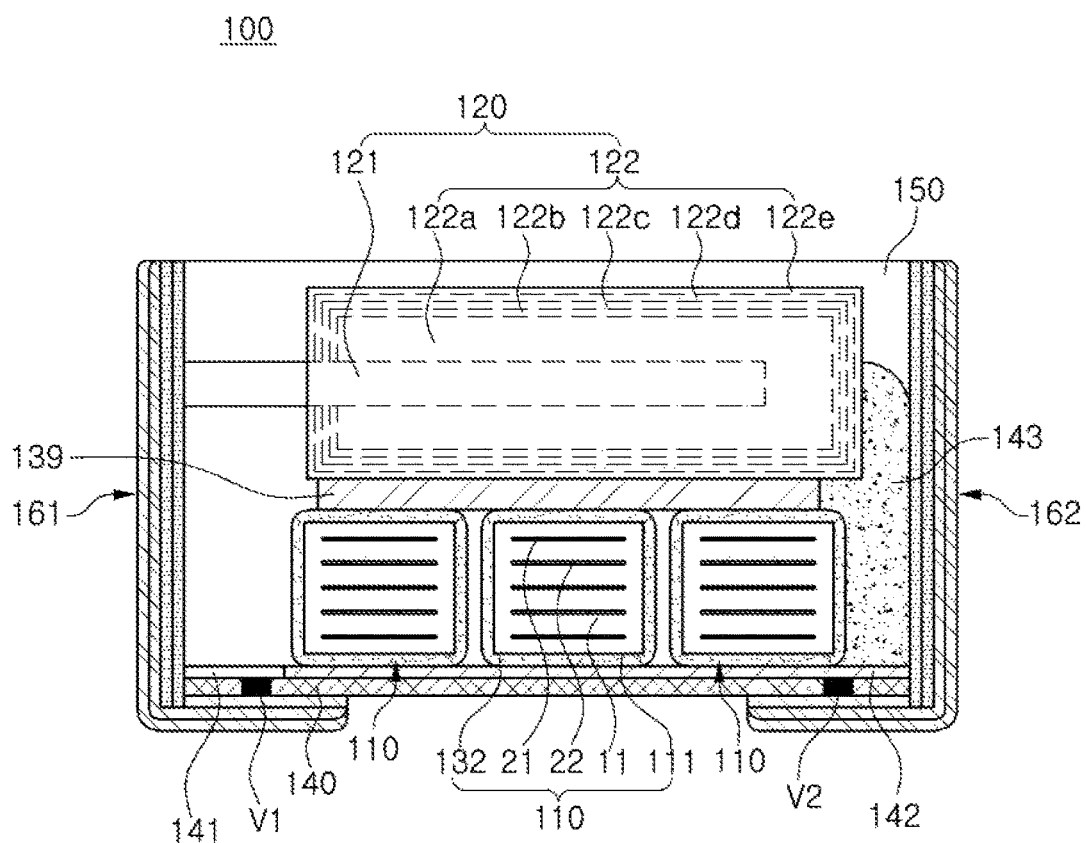
FIG. 5 is a cross-sectional view of a composite electronic component according to a modified example of the exemplary embodiment in the present disclosure.

FIG. 5 is a cross-sectional view of a composite electronic component according to a modified example of the exemplary embodiment in the present disclosure.

According to the present modified example, the composite electronic component according to the exemplary embodiment in the present disclosure may further include conductive vias V1 and V2 penetrating through the insulating sheet 140.

The conductive via may include the first conductive via V1 and the second conductive via V2. The first conductive via V1 may penetrate through the insulating sheet 140 and correspond to a region in which the first external electrode 131 of the multilayer ceramic capacitor is disposed and the second conductive via V2 may penetrate through the insulating sheet 140 and correspond to a region in which the second external electrode 132 of the multilayer ceramic capacitor is disposed.

According to the present modified example, when the composite electronic component further includes the conductive vias V1 and V2 penetrating through the insulating sheet 140, a current applied through the positive electrode terminal 161 and the negative electrode terminal 162 passes through the insulating sheet 140 to be transferred to the multilayer ceramic capacitor 110 disposed in the composite electronic component, to thereby further reduce a size of a current loop. As a result, the equivalent series inductance (ESL) of the composite electronic component may be further decreased.

According to an exemplary embodiment in the present disclosure, the tantalum capacitor and the multilayer ceramic capacitor may be connected to each other in parallel on the insulating sheet 140 used for forming a positive electrode terminal and a negative electrode terminal of a frameless tantalum capacitor that does not include the internal lead frame.

According to an exemplary embodiment in the present disclosure, the composite electronic component in which an impedance of the tantalum capacitor appears in a low frequency section and an impedance of the multilayer ceramic capacitor appears in a high frequency section may be provided.

Further, it is possible to provide the composite electronic component indicating the low equivalent series inductance while having the high capacitance.

The following Table 1 illustrates a comparison between the equivalent series inductance (ESL) of the composite electronic component (Example) according to the exemplary embodiment in the present disclosure and the equivalent series inductance (ESL) of the multilayer ceramic capacitor (Comparative Example 1), the tantalum capacitor (Comparative Example 2), and the composite electronic component (Comparative Example 3) in which the multilayer ceramic capacitor and the tantalum capacitor are horizontally coupled to each other.

The composite electronic component of the Comparative Example 3 is a form in which the multilayer ceramic capacitor of 4 μF and the tantalum capacitor of 6 μF are horizontally coupled to each other and have a capacitance of 10 μF and the composite electronic component according to the Example is a form in which three multilayer ceramic capacitors of 1.5 μF and the tantalum capacitor of 6 μF are vertically coupled to each other and has a capacitance of 10.5 μF.

TABLE 1

|  | Comparative Example 1 (10 μF) | Comparative Example 2 (10 μF) | Comparative Example 3 | Example |
|---|---|---|---|---|
| ESL (pH), 100 MHz | 187 | 256 | 124 | 72 |

Referring to the above Example 1, it may be appreciated that the composite electronic component according to the exemplary embodiment in the present disclosure has lower equivalent series inductance (ESL) than that of Comparative Examples 1 to 3.

Board on which Composite Electronic Component is Mounted

Figure 6:
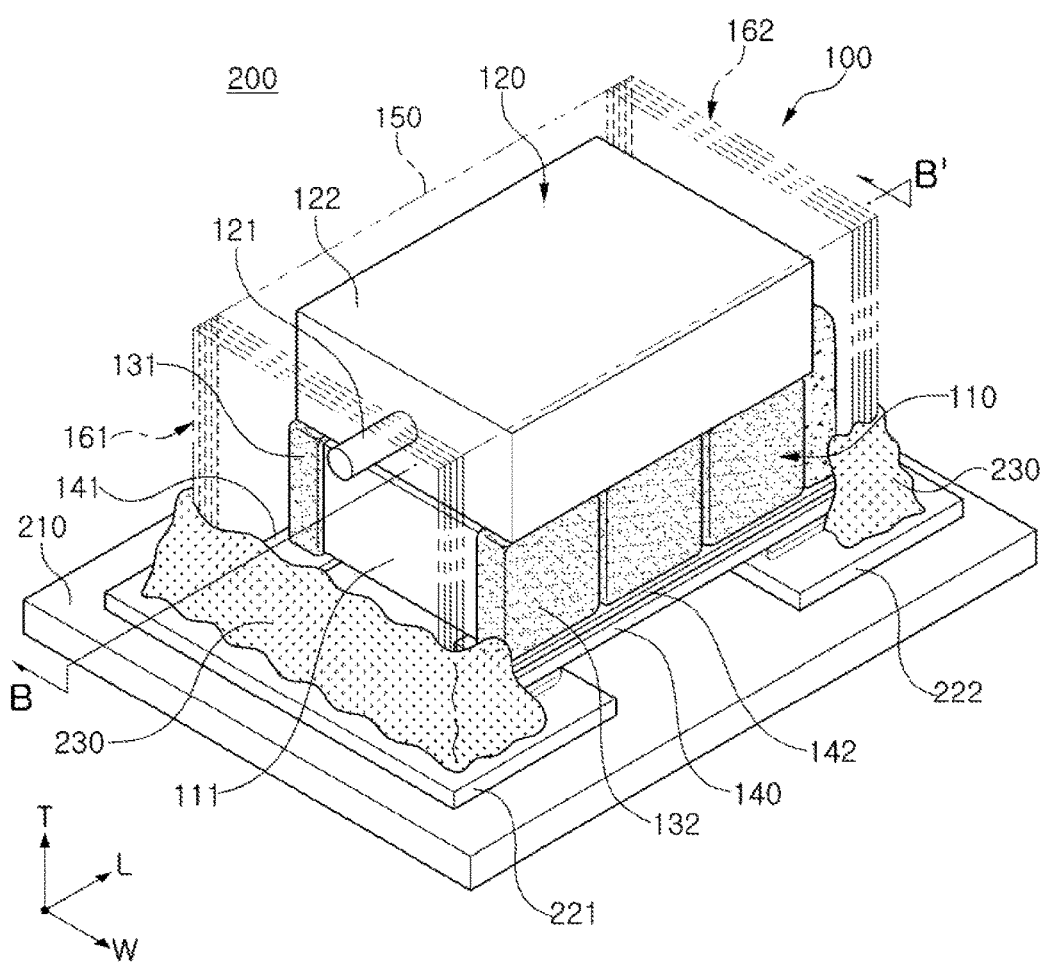
FIG. 6 is a perspective view illustrating the composite electronic component according to the exemplary embodiment in the present disclosure mounted on a printed circuit board.
Figure 7:
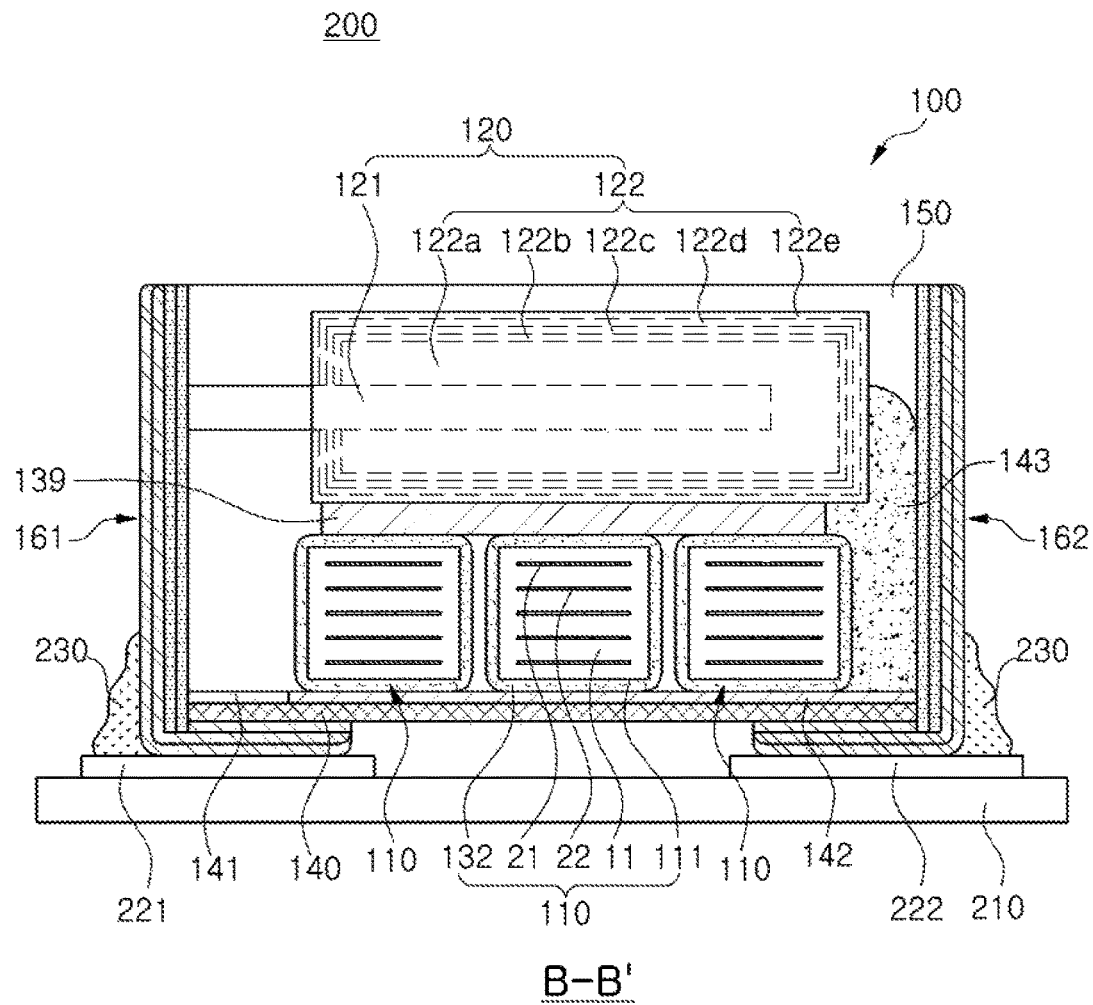
FIG. 7 is a cross-sectional view taken along line B-B' of FIG. 6.

FIG. 6 is a perspective view illustrating the composite electronic component according to the exemplary embodiment in the present disclosure mounted on a printed circuit board and FIG. 7 is a cross-sectional view taken along line B-B' of FIG. 6.

Referring to FIGS. 6 and 7, a board 200 on which a composite electronic component is mounted according to another exemplary embodiment in the present disclosure may include a printed circuit board 210 on which electrode pads 221 and 222 are disposed, the composite electronic component 100 installed on the printed circuit board 210, and a solder 230 connecting the electrode pads 221 and 222 and the composite electronic component 100.

The board 200 on which a composite electronic component is mounted according to the present exemplary embodiment may include the printed circuit board 210 on which the composite electronic component 100 is mounted and two or more electrode pads 221 and 222 formed on an upper surface of the printed circuit board 210.

The electrode pads 221 and 222 may include first and second electrode pads 221 and 222 connected to the positive electrode terminal 161 and the negative electrode terminal 162 of the composite electronic component, respectively.

Here, the positive electrode terminal 161 and the negative electrode terminal 162 of the composite electronic component may be electrically connected to the printed circuit board 810 by the solders 230 in a state in which they are positioned on the first and second electrode pads 221 and 222, respectively, so as to contact the first and second electrode pads 221 and 230, respectively.

As set forth above, according to the exemplary embodiments in the present disclosure, it is possible to provide the composite electronic component capable of implementing the low equivalent series inductance (ESL) and the low equivalent series resistance (ESR) and having the improved DC-bias characteristics and the high capacitance.

Further, according to the exemplary embodiment in the present disclosure, it is possible to provide the composite electronic component having the excellent acoustic noise reduction effect.

It is possible to implement a significantly lower degree of equivalent series inductance (ESL) characteristics by adjusting the disposition and number of the multilayer ceramic capacitors and the tantalum capacitors.

While exemplary embodiments have been shown and described above, it will be apparent to those skilled in the art that modifications and variations could be made without departing from the spirit and scope of the present disclosure as defined by the appended claims.

What is claimed is:

1. A composite electronic component, comprising:
a plurality of multilayer ceramic capacitors each including a ceramic body in which dielectric layers and internal electrodes are alternately disposed and first and second external electrodes disposed on a lower surface of the ceramic body;
a tantalum capacitor including a body part including a sintered tantalum powder material and a tantalum wire of which a portion is embedded in the body part and disposed on the plurality of multilayer ceramic capacitors;
a molding portion enclosing the tantalum capacitor and the plurality of multilayer ceramic capacitors;
a positive electrode terminal disposed on a first side surface of the molding portion in a length direction and a lower surface of an insulating sheet; and
a negative electrode terminal disposed on a second side surface of the molding portion in the length direction and the lower surface of the insulating sheet,
wherein each of the positive electrode terminal and the negative electrode terminal includes a lower surface base layer, a side surface base layer connected to the lower surface base layer, and a plating layer enclosing the lower surface base layer and the side surface base layer.

2. The composite electronic component of claim 1, wherein the tantalum capacitor and the plurality of multilayer ceramic capacitors are electrically connected to each other in parallel.

3. The composite electronic component of claim 1, wherein the first external electrodes of the plurality of multilayer ceramic capacitors and the tantalum wire of the tantalum capacitor are electrically connected to the positive electrode terminal.

4. The composite electronic component of claim 1, wherein the second external electrodes of the plurality of multilayer ceramic capacitors and the body part of the tantalum capacitor are electrically connected to the negative electrode terminal.

5. The composite electronic component of claim 4, further comprising an electrically conductive connection part, disposed between the tantalum capacitor and the negative electrode terminal, electrically connecting the body part of the tantalum capacitor to the negative electrode terminal.

6. The composite electronic component of claim 1, wherein each lower surface base layer is formed by etching.

7. The composite electronic component of claim 1, wherein each side surface base layer is formed by deposition.

8. The composite electronic component of claim 1, wherein the insulating sheet is disposed below the plurality of multilayer ceramic capacitors and the tantalum capacitor.

9. The composite electronic component of claim 8, further comprising a conductive via penetrating through the insulating sheet.

10. The composite electronic component of claim 8, further comprising a conductive connection part disposed on an upper surface of the insulating sheet.

11. The composite electronic component of claim 10, wherein the conductive connection part includes a metal pad.

12. The composite electronic component of claim 10, wherein the conductive connection part includes a conductive resin.

13. The composite electronic component of claim 10, wherein the conductive connection part includes first and second conductive connection parts respectively disposed on a side surface of the molding portion in a width direction.

14. The composite electronic component of claim 13, wherein the first conductive connection part is connected to the positive electrode terminal and the second conductive connection part is connected to the negative electrode terminal.

15. A board on which a composite electronic component is mounted, comprising:
a printed circuit board on which an electrode pad is disposed;
a composite electronic component disposed on the printed circuit board; and
a solder connecting the electrode pad and the composite electronic component,
wherein the composite electronic component includes:
a plurality of multilayer ceramic capacitors each including a ceramic body in which dielectric layers and internal electrodes are alternately disposed and first and second external electrodes disposed on a lower surface of the ceramic body;
a tantalum capacitor including a body part including a sintered tantalum powder material and a tantalum wire of which a portion is embedded in the body part and disposed on the plurality of multilayer ceramic capacitors;
a molding portion enclosing the tantalum capacitor and the plurality of multilayer ceramic capacitors;
a positive electrode terminal disposed on a first side surface of the molding portion in a length direction and a lower surface of an insulating sheet; and
a negative electrode terminal disposed on a second side surface of the molding portion in the length direction and the lower surface of the insulating sheet,
wherein each of the positive electrode terminal and the negative electrode terminal includes a lower surface base layer, a side surface base layer connected to the lower surface base layer, and a plating layer enclosing the lower surface base layer and the side surface base layer.

* * * * *